United States Patent
Choi (10) Patent No.: US 7,153,770 B2
(45) Date of Patent: Dec. 26, 2006

(54) METHOD OF MANUFACTURING SEMICONDUCTOR DEVICE AND SEMICONDUCTOR DEVICE MANUFACTURED USING THE SAME

(75) Inventor: Chel-jong Choi, Kyungki-do (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 231 days.

(21) Appl. No.: 10/745,578

(22) Filed: Dec. 29, 2003

(65) Prior Publication Data

US 2005/0026428 A1    Feb. 3, 2005

(30) Foreign Application Priority Data

Aug. 2, 2003    (KR)    .................... 10-2003-0053625

(51) Int. Cl.
*H00L 21/44*    (2006.01)
(52) U.S. Cl. .................... 438/653; 435/664; 435/721; 435/755; 435/E21.165
(58) Field of Classification Search ................ 438/230, 438/231, 232, 653; 257/412–413
See application file for complete search history.

(56) References Cited

U.S. PATENT DOCUMENTS

| | | | | |
|---|---|---|---|---|
| 5,739,064 | A | * | 4/1998 | Hu et al. .................... 438/528 |
| 5,856,698 | A | * | 1/1999 | Hu et al. .................... 257/412 |
| 6,468,901 | B1 | | 10/2002 | Maa et al. |
| 6,492,694 | B1 | * | 12/2002 | Noble et al. ................. 257/410 |
| 6,534,871 | B1 | | 3/2003 | Maa et al. |
| 6,727,135 | B1 | * | 4/2004 | Lee et al. .................... 438/230 |
| 2002/0045307 | A1 | | 4/2002 | Kittl et al. |
| 2004/0061228 | A1 | * | 4/2004 | Wieczorek et al. ......... 257/750 |

OTHER PUBLICATIONS

Chel-Jong Choi et al. "Effects of a $SiO_2$ Capping Layer on the Electrical Properties and Morphology of Nickel Silicides", Journal Applied Physics, 2002, pp. 1969-1973, vol. 41, The Japan Society of Applied Physics, Japan.

F. La Via et al., "Thermal Stability of Thin $CoSi_2$ Layers on Polysilicon Implanted with As, $BF_2$, and Si", Journal Vac. Sci. Technol., 1998, pp. 1129-1136, vol. B16, No. 3, American Vacuum Society.

D. Mangelinck et al., "Enhancement of Thermal Stability of NiSi Films on (100) Si and (111) Si by Pt Addition", Applied Physics Letters, 1999, pp. 1736-1738, vol. 75, No. 12, American Institute of Physics.

Jer-Shen Maa et al., "Effect of Interlayer on Thermal Stability of Nickel Silicide", J.Vac.Sci. Technol. A., 2001, pp. 1595-1599, vol. 19, No. 4, American Vacuum Society.

Young-Woo Ok et al., "Effect of Mo Interlayer on the Electrical and Structural Properties of Nickel Silicides", Journal of the Electrochemical Society, 2003, pp. G385-G388, vol. 150, No. 7, The Electrochemical Society, Inc.

J.S. Kwak et al. "Prediction of Solid-state Amorphizing Reaction Using Effective Driving Force", Journal of Applied Physics, 1995, pp. 983-987, vol. 78, No. 2, American Institute of Physics.

* cited by examiner

*Primary Examiner*—Dung A. Le
(74) *Attorney, Agent, or Firm*—Buchanan Ingersoll & Rooney PC (57) ABSTRACT

A semiconductor device comprising a metal silicide film with uniform surface morphology and interface morphology and a method of manufacturing the same are provided. The metal silicide film of the semiconductor device exhibits low sheet resistance and excellent thermal stability. Therefore, by using the semiconductor device fabrication method, high performance, high quality semiconductor devices can be manufactured.

11 Claims, 7 Drawing Sheets

METHOD OF MANUFACTURING SEMICONDUCTOR DEVICE AND SEMICONDUCTOR DEVICE MANUFACTURED USING THE SAME

BACKGROUND OF THE INVENTION

This application claims priority from Korean Patent Application No. 2003-0053625, filed on Aug. 2, 2003, in the Korean Intellectual Property Office, the disclosure of which is incorporated herein by reference in its entirety.

1. Field of the Disclosure

The present disclosure relates to a method of manufacturing a semiconductor device, and a semiconductor device manufactured using the same. More particularly, the present disclosure relates to a method of manufacturing a high performance semiconductor device with low sheet resistance and excellent thermal stability, and a semiconductor device manufactured using the same.

2. Description of the Related Art

With increasing integration of semiconductor devices, semiconductor devices with linewidth of less than submicrometer size are increasingly in demand. Accordingly, influences of contact and sheet resistance on operation characteristics of semiconductor devices become increasingly important.

A silicide process has been widely used to form silicide contacts on the gate and source/drain of metal oxide semiconductor field effect transistors (MOSFETs) or on the emitter, base, and collector of bipolar devices. A silicide process is a process of forming a stable metal compound by reacting silicon and metal and reduces the sheet and contact resistance at contact regions. The process is useful in obtaining high performance semiconductor devices. Meanwhile, silicide process or a self-aligned silicide process has been used in fabrication of many logic devices. However, in the fields of next generation high-speed complementary metal oxide silicon (CMOS) logic devices and embedded dynamic random access memory (DRAM) devices formed by combination of logic devices and DRAM devices, there has been a need for the development of new silicide materials that can provide more excellent characteristics than $TiSi_2$ and $CoSi_2$ which have been mainly applied in conventional silicide processes.

Recently, nickel monosilicide (NiSi) has been proposed and studied as a silicide material suitable for a next generation ultralarge-scale integrated (ULSI) semiconductor process. The NiSi can be formed with low resistivity of about 14 $\mu\Omega$·cm by only one annealing process. A film made of the NiSi exhibits no increase of resistivity even on narrow (1 μm in linewidth, for example) poly-Si gates. Furthermore, since NiSi does not react with nitrogen gas used during annealing and almost all of deposited Ni reacts with Si, the amount of Si consumed during the reaction can be adjusted precisely. Still furthermore, the NiSi has other valuable merits, such as low reactivity of it with dopants in the source/drain region and less Si consumption for formation of the NiSi with a constant thickness, when compared with the Si consumption for formation of other silicide, in particular, $CoSi_2$, which is the most widely used silicide. Therefore, NiSi is silicide that is very suitable for next generation ULSI devices.

However, when used for actual Si devices, the NiSi has a serious problem of low thermal stability at high temperature during a succeeding annealing process. Many solutions for such a problem have been suggested.

Mangelinck et al. reported that when Ni, inclusive of 5 atomic % platinum (Pt), is deposited on a Si substrate, followed by annealing, an NiSi film with enhanced thermal stability is formed [D. Mangelinck, J. Y. Dai, J. S. Pan, and S. K. Lahiri, Applied Physics Letters, 75, (1999) pp. 1736]. However, due to the added Pt, there is a problem in that an electrically active defect is observed in n-type Si. Maa et al. proposed insertion of an iridium (Ir) or cobalt (Co) layer between an Ni layer and a Si substrate [U.S. Pat. Nos. 6,468,901 and 6,534,871, and J. S. Maa, Y. Ono, D. J. Tweet, F. Zhang, and S. T. Hsu, Journal of Vacuum Science & Technology A, 19 (2001) pp. 1595]. However, in case of using the Ir layer, since Ir is not easily etched during etching, it is difficult to actually apply the Ir layer to Si devices. On the other hand, in case of using the Co layer, due to high reactivity of Co and Si, a Co-silicide spike is easily formed. As a result, generation of abnormal junction leakage current may increase.

U.S. patent application Laid-Open Publication No. US 2002-0045307 A1, issued to Kittel et al., discloses a method of manufacturing low resistance Co-, W-, Mo-, Ni-, Pt, and Pd-silicide, comprising: inserting refractory metals such as Mo, Co, W, Ta, Nb, Ru, and Cr into a Si-containing layer intended for silicide formation and depositing Co, W, Mo, Ni, Pt, and Pd on the Si-containing layer, followed by annealing. Here, ion implantation, physical vapor deposition (PVD), or chemical vapor deposition (CVD) is used for the insertion of the refractory metals into the Si-containing layer. However, according to this method, since the insertion of the refractory metals into the Si-containing layer is carried out after formation of a gate material, silicide with enhanced characteristics can be formed only on a gate region. For this reason, there is a problem in that a source/drain region, which can greatly influence operation characteristics of Si devices, cannot have good silicide. Therefore, there is a need for development of more improved processes for formation of NiSi to be applied to actual Si devices.

SUMMARY OF THE DISCLOSURE

The present disclosure provides an improved method of manufacturing a semiconductor device comprising a metal silicide film.

The present disclosure also provides an improved semiconductor device comprising a metal silicide film.

According to an aspect of the present disclosure, there is provided a method of manufacturing a semiconductor device, the method comprising: forming a silicon (Si)-containing gate region, a gate oxide film, a sidewall spacer, and a source/drain region with a lightly doped drain (LDD) structure on a Si-containing substrate to form a transistor structure; forming a diffusion barrier film on the entire surface of the Si-containing substrate; forming a metal film on the diffusion barrier film; and annealing the Si-containing substrate so that the Si-containing gate region and the source/drain region react with the metal film to selectively form a metal silicide film only at the surfaces of the gate region and the source/drain region.

According to another aspect of the present disclosure, there is provided a method of manufacturing a semiconductor device, the method comprising: forming a diffusion barrier film on a Si-containing substrate or a Si film; forming a metal film on the diffusion barrier film; and annealing the resultant structure so that the Si-containing substrate or the Si film reacts with the metal film to form a metal silicide film.

According to yet another aspect of the present disclosure, there is provided a semiconductor device comprising a Si-containing gate region, a gate oxide film, a sidewall spacer, and a source/drain region with a LDD structure, all of which are formed in/on a Si-containing substrate, wherein the device further comprises a metal silicide film containing 0.1 to 10 atomic % of molybdenum (Mo) which is selectively formed only at the surfaces of the Si-containing gate region and the source/drain region.

According to the present disclosure, a diffusion barrier film is disposed between a metal film and a Si-containing substrate to uniformly adjust the diffusion flux of a metal of the metal film toward the Si-containing substrate. When a resultant structure is annealed, the metal of the metal film uniformly reacts with Si of the Si-containing substrate or a Si-containing gate region. As a result, a metal silicide film with uniform surface morphology and interface can be formed. Since the metal silicide film thus formed exhibits low sheet resistance and excellent thermal stability, high performance, high quality semiconductor devices can be manufactured.

BRIEF DESCRIPTION OF THE DRAWINGS

The above and other features and advantages of the present disclosure will become more apparent by describing in detail exemplary embodiments thereof with reference to the attached drawings in which:

FIG. 6 is a graph illustrating quantitative analysis result by Auger electron spectroscopy (AES) of distribution of elements present in semiconductor device samples manufactured using Mo films as diffusion barrier films: (FIG. 6A) immediately after deposition of Ni films, (FIG. 6B) at a RTA temperature of 500° C., and (FIG. 6C) at a RTA temperature of 800° C.

DETAILED DESCRIPTION OF THE DISCLOSURE

FIGS. 1A through 1D are schematic sectional views showing sequential processes of manufacturing a semiconductor device according to an embodiment of the present disclosure.

Figure 1A:
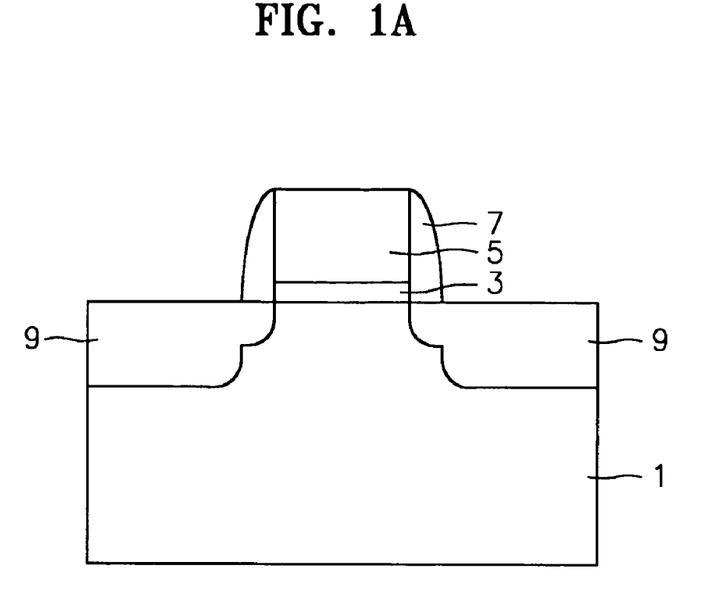
FIGS. 1A through 1D are schematic sectional views showing sequential processes of manufacturing a semiconductor device according to an embodiment of the present disclosure.

Referring to FIG. 1A, a basic transistor structure comprising a gate oxide film 3, a gate 5, a sidewall spacer 7, and a source/drain region 9 with a lightly doped drain (LDD) structure is formed on a Si-containing substrate 1. A fabrication method of such a transistor structure has been well known in the pertinent art and disclosed in a large number of documents.

Preferably, the substrate is made of monocrystalline Si. However, any of Si-containing substrates, for example, substrates made of polycrystalline Si, doped Si, amorphous Si, $Si_xGe_{1-x}$ where x is any number satisfying $0<x<1$, $Si_xN_{1-x}$ where x is any number satisfying $0<x<1$, or SiC, can be used.

Figure 1B:
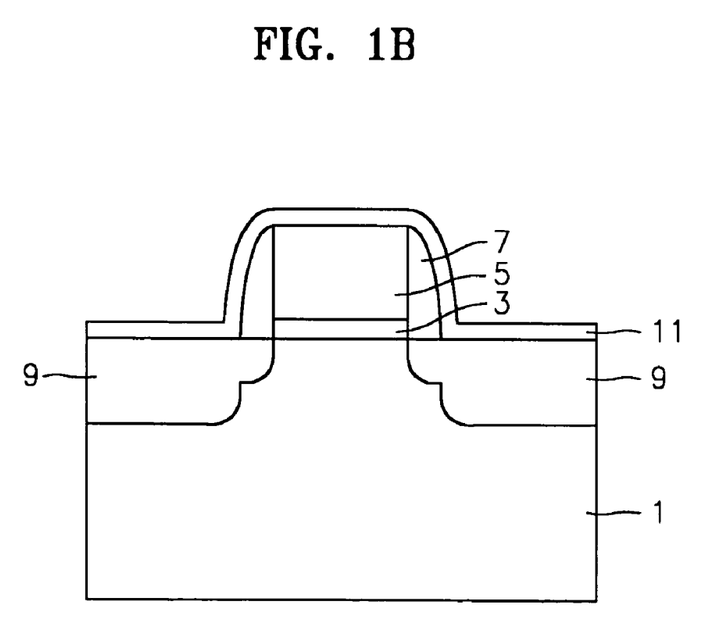

Referring to FIG. 1B, after a native oxide film present in the source/drain and gate regions is removed using a conventional method, a diffusion barrier film 11 is deposited on the substrate 1.

Preferably, the diffusion barrier film 11 is made of at least one selected from the group consisting of Mo, Ta, Mn, Cr, W, Pd, Au, Ag, Cu, Hf, Fe, Zn, Ru, Pb, Mg, and alloys thereof. The diffusion barrier film 11 may have a thickness of 0.1 to 100 nm. It is substantially impossible to form the diffusion barrier film 11 with a thickness of less than 0.1 nm. On the other hand, if the thickness of the diffusion barrier film 11 exceeds 100 nm, a metal of the diffusion barrier film 11 is more than enough remained in a finally formed metal silicide film, and thus, it is difficult to control electrical properties of the metal silicide film.

Figure 1C:
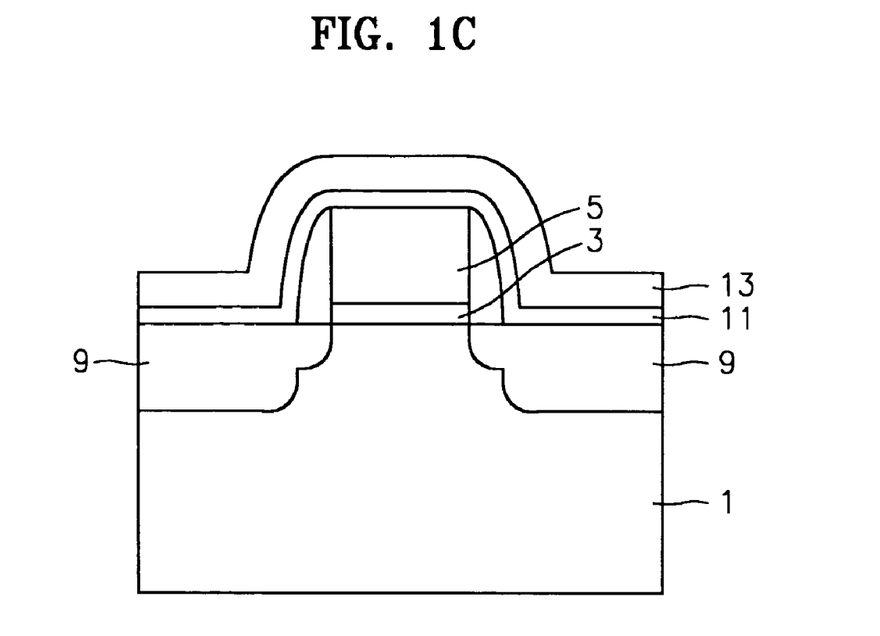

Referring to FIG. 1C, a metal film 13 is deposited on the substrate 1 using a conventional method to form a structure of the metal film 13/diffusion barrier film 11/substrate 1. Preferably, the metal film 13 is made of at least one selected from the group consisting of Ni, Ti, Pt, Pd, Ir, Ta, Nb, V, Cr, Hf, Zr, Mo, and alloys thereof. The metal film 13 may have a thickness of 1 to 1,000 nm. If the thickness of the metal film 13 is less than 1 nm, it is difficult to precisely control the reaction of a metal of the metal film 13 and Si of a Si-containing layer. On the other hand, if the thickness of the metal film 13 exceeds 1,000 nm, a metal silicide film is formed in excess, and thus, junction penetration may occur.

In order to deposit the diffusion barrier film 11 and the metal film 13 to a desired thickness on the substrate 1, any known deposition method, such as an e-beam evaporation, chemical vapor deposition (CVD), physical vapor deposition (PVD), metal-organic CVD (MOCVD), molecular beam epitaxy (MBE), or sputtering may be used. The thickness of the diffusion barrier film 11 and the metal film 13 can be easily adjusted by varying the output and deposition time of a deposition apparatus.

Figure 1D:
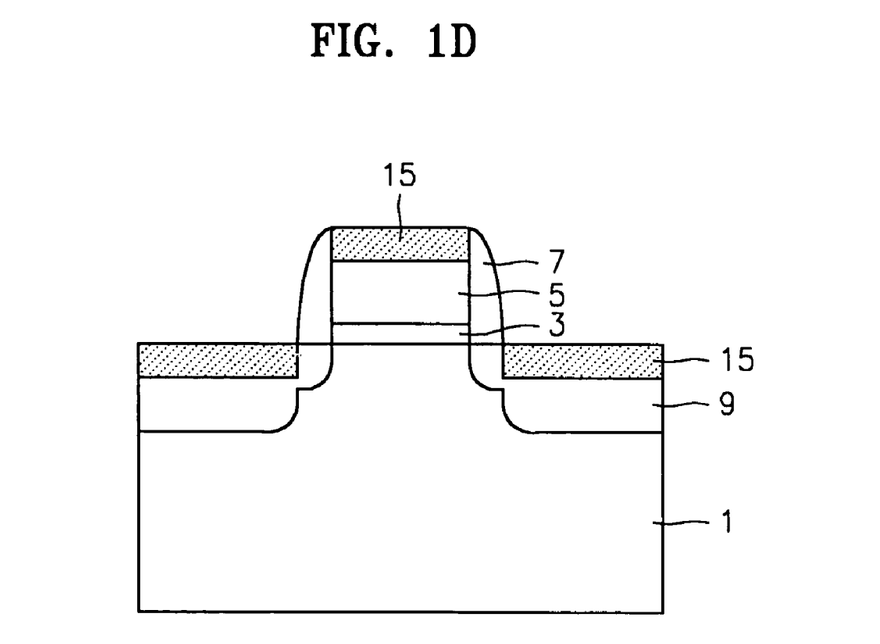

Referring to FIG. 1D, a resultant structure thus formed is subjected to rapid thermal annealing (RTA) under an inert gas atmosphere to form a metal silicide film 15. The metal silicide film 15 is formed only at an upper surface of the gate region 5 and a high-concentration impurity region of the source/drain region 9.

The RTA is carried out at a temperature range of 100 to 1,000° C., preferably 300 to 700° C., and more preferably 400 to 800° C., under an $N_2$ gas atmosphere, and for about 30 seconds. After the RTA, an unreacted metal is removed. As a result, the metal silicide film 15 is selectively formed only on the gate region 5 and the source/drain region 9. If the annealing temperature is less than 300° C., $M_2Si$ (M is a metal such as Ni, Ti, and Pt) instead of MSi may be generated. On the other hand, if the annealing temperature exceeds 700° C., $MSi_2$ may be generated.

During the annealing, a metal of the metal film 13 diffuses toward the underlying substrate 1 and then reacts with Si of the source/drain region 9 and the gate region 5 to thereby form the metal silicide film 15. In the course of the diffusion, the diffusion barrier film 11 formed between the metal film 13 and the substrate 1 uniformly adjusts the diffusion flux of a metal of the metal film 13. Therefore, a metal of the metal film 13 can uniformly react with Si of the source/drain region 9 and the gate region 5, and thus, the obtained metal silicide film 15 has uniform surface morphology and interface morphology. As a result, the metal silicide film 15 can exhibit low sheet resistance and excellent thermal stability. Therefore, high performance, high quality semiconductor devices such as complementary metal oxide silicon (CMOS) logic devices, memory devices, and embedded memory devices can be manufactured.

The metal silicide film 15 contained in a semiconductor device manufactured according to the above-described method comprises at least one selected from the group consisting of Mo, Ta, Mn, Cr, W, Pd, Au, Ag, Cu, Hf, Fe, Zn, Ru, Pb, Mg, and alloys thereof in an amount of about 0.1 to 10 atomic %. The presence of a metal such as Mo and Ta in the metal silicide film 15 indicates that the diffusion barrier film 11 made of a metal such as Mo and Ta was used in fabrication of the metal silicide film 15. It is substantially impossible to set the residual amount of a metal such as Mo and Ta to less than 0.1 atomic %. On the other hand, if the residual amount of a metal such as Mo and Ta exceeds 10 atomic %, such a metal may adversely affect electrical properties of the metal silicide film 15. The residual amount of Mo present in the metal silicide film 15 can be determined using a secondary ion mass spectroscopy (SIMS) apparatus or an Auger electron spectroscopy (AES) apparatus.

Hereinafter, the present invention will be described more specifically by examples. However, the following examples are provided only for illustrations and thus the present invention is not limited to or by them.

EXAMPLE

According to the above method described with reference to FIGS. 1A through 1D, semiconductor device samples, in which NiSi films were selectively formed only on gate and source/drain regions, were manufactured.

In detail, basic transistor structures comprising gate oxide films, gate regions, sidewall spacers, and source/drain regions of a LDD structure were formed on monocrystalline Si substrates according to a conventional method. Then, native oxide films present in the source/drain regions and the gate regions were removed by using a conventional method and then Mo-diffusion barrier films (hereinafter, simply referred to as "Mo films") were deposited to a thickness of 1.5 nm on the entire surfaces of the substrates using an e-beam evaporator. Then, Ni films were deposited to a thickness of 28 nm on the entire surfaces of the substrates having the Mo films.

The substrates were subjected to RTA under a nitrogen gas atmosphere with varying RTA temperatures to form the NiSi films. Then, unreacted nickel was removed by wet-etching using a mixed solvent (sulfuric acid (95%): hydrogen peroxide (100%)=3:1 (v/v)). As a result, the NiSi films were selectively formed only on the gate and source/drain regions.

COMPARATIVE EXAMPLE

Semiconductor device samples comprising NiSi films were prepared in the same manner as in Example except that the Mo films were not formed and the Ni films were deposited to a thickness of 30 nm.

Analysis

Figure 2:
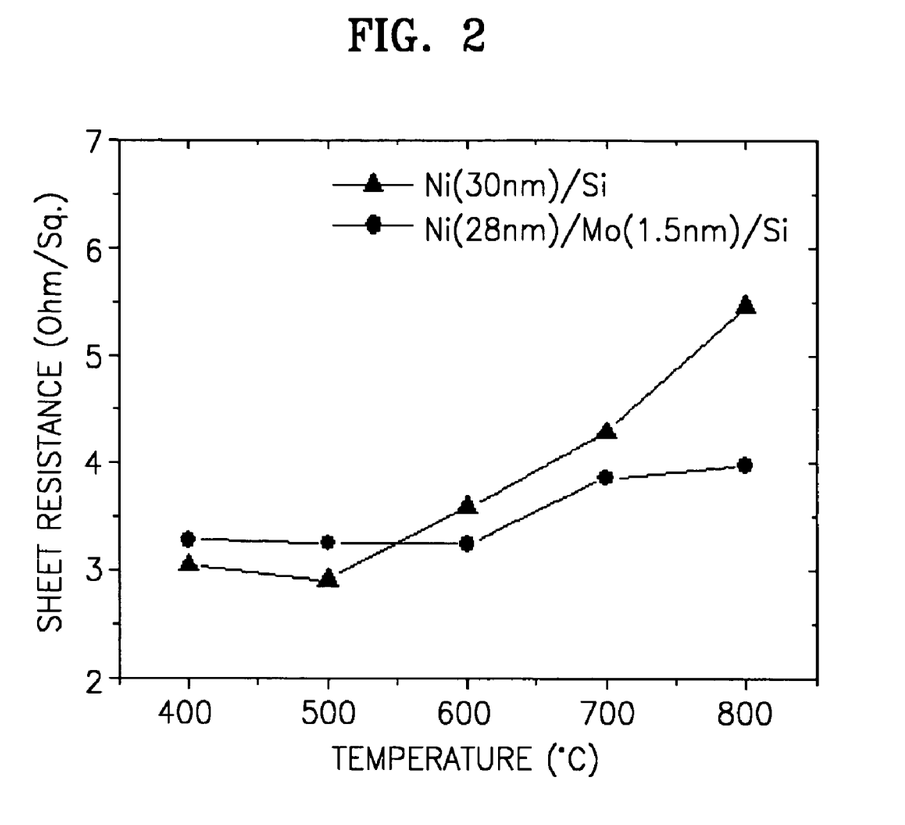
FIG. 2 is a graph illustrating a change of sheet resistance of NiSi films in semiconductor device samples manufactured with using Mo films as diffusion barrier films (Example) and without using diffusion barrier films (Comparative Example) as a function of temperature of rapid thermal annealing (RTA)

FIG. 2 is a graph illustrating a change of sheet resistance of the NiSi films in the semiconductor device samples manufactured with using the Mo films as diffusion barrier films (Example) and without using diffusion barrier films (Comparative Example) as a function of RTA temperature. The sheet resistance was measured by means of the 4-point probe method.

That is, FIG. 2 shows results of sheet resistance of the NiSi films measured by means of the 4-point probe method after the semiconductor device samples manufactured with using the Mo films (Example) and without using the Mo films (Comparative Example) were subjected to RTA at varying temperatures.

Referring to FIG. 2, in case of the semiconductor device samples (▲) manufactured without using the Mo films, the sheet resistance of the NiSi films was constantly maintained at an annealing temperature range of 500° C. or less, but increased rapidly with increasing annealing temperature above 500° C. On the other hand, in case of the semiconductor device samples (●) manufactured with using the Mo films, the sheet resistance of the NiSi films was constantly maintained at an annealing temperature of up to 600° C., and then increased gradually. In comparison with an increase rate in sheet resistance of the NiSi films as a function of annealing temperature between the two types of semiconductor device samples, the semiconductor device samples with using the Mo films exhibited about three times less increase rate in sheet resistance of the NiSi films than those manufactured without using the Mo films. Therefore, it can be seen that annealing after the insertion of Mo films between Si substrates and Ni films for formation of NiSi films rapidly reduces increase behavior of the surface resistance of the NiSi films with increasing annealing temperatures.

Meanwhile, as shown in FIG. 2, at a temperature range of 500° C. or less, the semiconductor device samples manufactured with using the Mo films exhibited the sheet resistance higher than those manufactured without using the Mo films. This is because the thickness of the NiSi films formed in the former samples is thinner than that in the latter samples. However, the sheet resistance of the NiSi films in the semiconductor device samples manufactured with using the Mo films can be easily reduced by increasing the deposition thickness of Ni.

Figure 3:
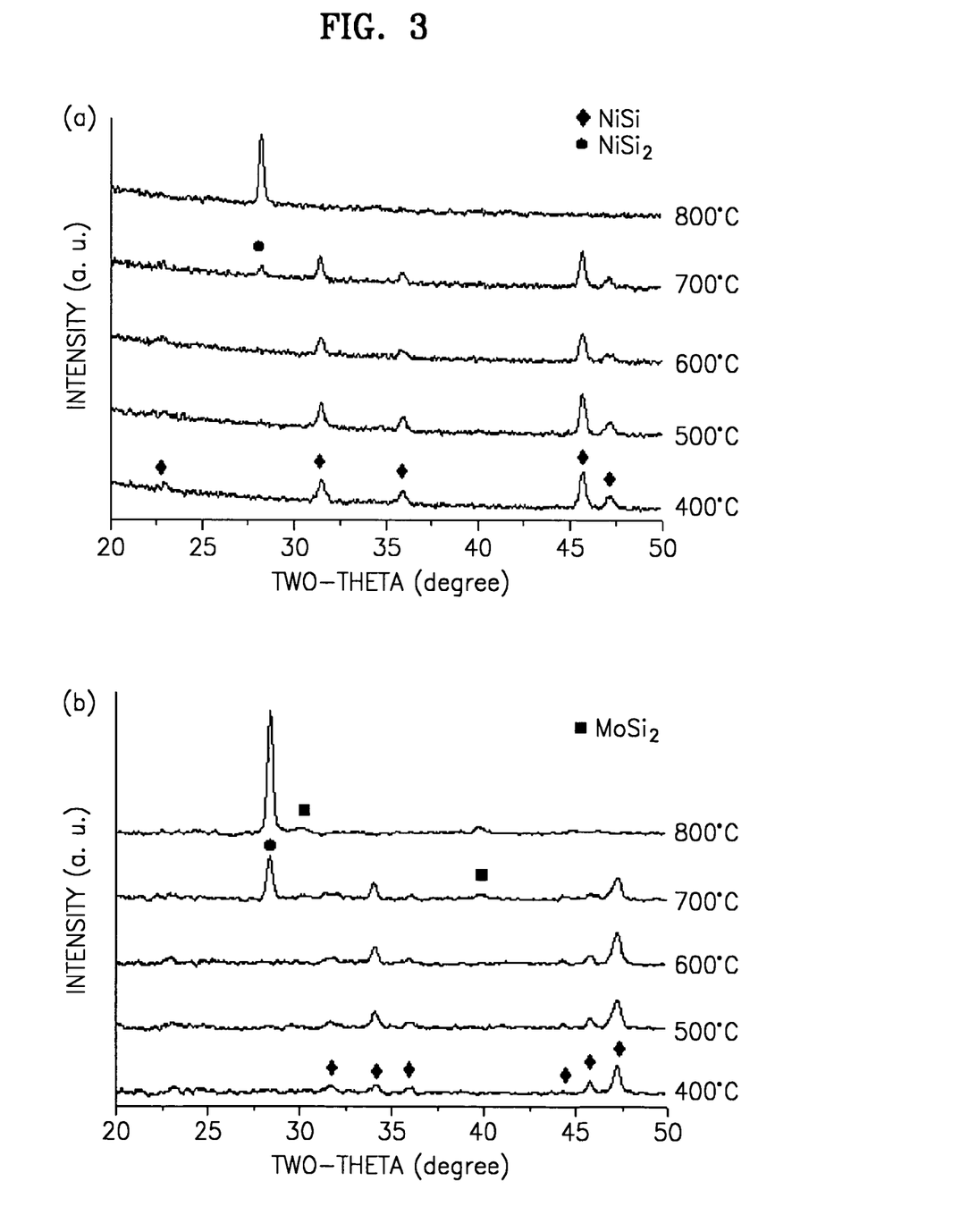
FIG. 3 is a graph illustrating a change of glancing angle X-ray diffraction (GXRD) pattern of NiSi films in semiconductor device samples manufactured with using Mo films as diffusion barrier films (Example, (a)) and without using diffusion barrier films (Comparative Example, (b)) as a function of RTA temperature.

FIG. 3 shows a graph of a change of glancing angle X-ray diffraction (GXRD) pattern of the NiSi films in the semiconductor device samples manufactured with using the Mo films as diffusion barrier films (Example, (b)) and without using diffusion barrier films (Comparative Example, (b)) as a function of RTA temperature.

Referring to FIG. 3, at an annealing temperature range of 600° C. or less, only NiSi phase was observed in the two types of samples. However, in case of the samples manufactured with using the Mo films (b), after RTA at 700° C., $MoSi_2$ phase formed by reaction of Mo of the Mo films with Si coexisted with NiSi and $NiSi_2$ phases. After RTA at 800°

C., MoSi$_2$ and NiSi$_2$ phases were observed. On the other hand, in case of the samples manufactured without using the Mo films (a), after RTA at 700° C., NiSi and NiSi$_2$ phases coexisted. After RTA at 800° C., only NiSi$_2$ phase was observed. That is, the GXRD results of FIG. 3 shows that Mo of the inserted Mo films does not react with Ni of the Ni films within an annealing temperature range intended for formation of NiSi phase.

Figure 4:
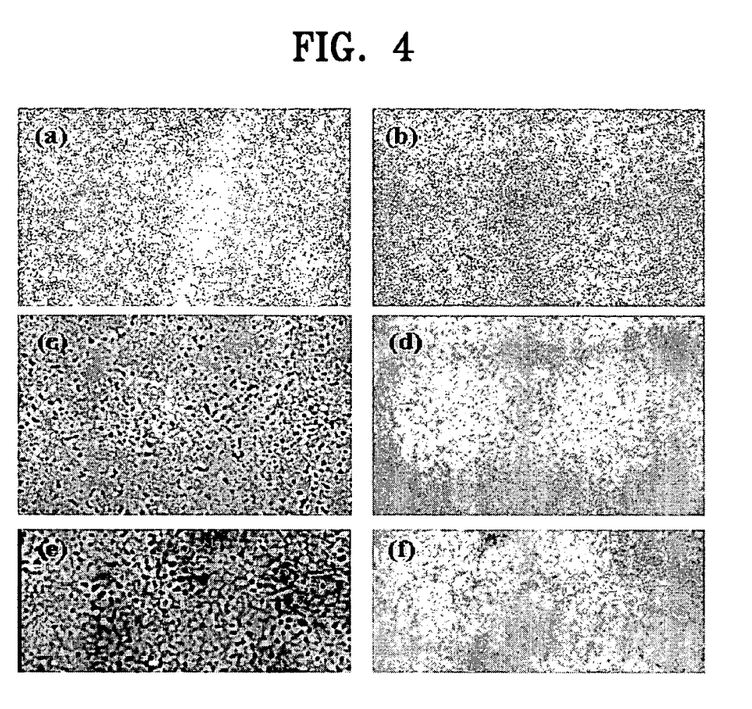
FIG. 4 is a scanning electron microscopy (SEM) photograph showing a change of surface morphologies of NiSi films in semiconductor device samples manufactured with using Mo films as diffusion barrier films (Examples, (b), (d), and (f)) and without using diffusion barrier films (Comparative Examples, (a), (c), and (e)) as a function of RTA temperature.

FIG. 4 is a scanning electron microscopy (SEM) photograph showing a change of surface morphologies of the NiSi films in the semiconductor device samples manufactured with using the Mo films as diffusion barrier films (Examples, (b), (d), and (f)) and without using diffusion barrier films (Comparative Examples, (a), (c), and (e)) as a function of RTA temperature. Here, the samples of (a) and (b) were annealed at 400° C., the samples of (c) and (d) at 600° C., and the samples of (e) and (f) at 800° C.

Referring to FIG. 4, in case of the samples without using the Mo films, while the NiSi films, which were annealed at 400° C., exhibited good surface morphologies (a), severe degradation of surface morphologies was observed in the NiSi films annealed at above 400° C. ((c) and (e)). Specifically, as can be seen from the SEM photographs of the samples annealed at 600 and 800° C., the samples had very rough surfaces, and due to agglomeration of NiSi, underlying Si regions (dark blobs) were exposed without being covered with the NiSi films. However, in case of the samples manufactured with using the Mo films according to Example of the present invention, surface morphologies were not severely degraded even when annealing was carried out at above 400° C. ((d) and (f)), as well as at 400° C. (a). Specifically, the samples manufactured with using the Mo films according to Example of the present invention exhibited the same surface morphologies as those manufactured without using the Mo films, after annealing at up to 400° C. However, the samples manufactured with using the Mo films exhibited significantly reduced surface degradation after annealing at above 400° C., when compared to those manufactured without using the Mo films.

Figure 5:
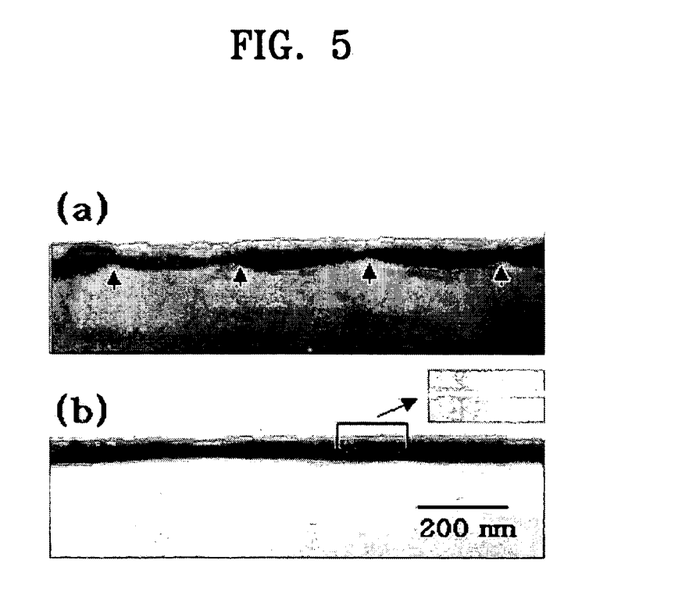
FIG. 5 is a cross-sectional transmission electron microscopy (TEM) photograph showing NiSi films in semiconductor device samples manufactured with using Mo films as diffusion barrier films (Example, (b)) and without using diffusion barrier films (Comparative Example, (a)), at a RTA temperature of 600° C.

FIG. 5 is a cross-sectional transmission electron microscopy (TEM) photograph of the NiSi films in the semiconductor device samples manufactured with using the Mo films as diffusion barrier films (Example, (b)) and without using diffusion barrier films (Comparative Example, (a)), at a RTA temperature of 600° C.

Referring to FIG. 5, in case of the NiSi films contained in the samples manufactured without using the Mo films (a), many thermal grooves (indicated by arrows) were observed at interfaces between the NiSi films and the Si substrates. The formation of such thermal grooves indicates that agglomeration is in progress in the samples manufactured without using the Mo films. However, in case of the NiSi films contained in the samples manufactured with using the Mo films (b), very uniform interfaces of the NiSi films/Si substrates were observed. The reason no agglomeration occurs may be that the Mo films control the diffusion flux of Ni toward the Si substrates during annealing.

Meanwhile, as seen from a high resolution electron microscopy (HREM) image of the inset of (b) in FIG. 5, a thin amorphous layer (a central layer) was formed on an NiSi film (a lower layer). According to analysis results by energy dispersive x-ray spectroscopy (EDX) and Auger electron spectroscopy (AES), the amorphous layer was made of Mo. This result shows that during RTA, while Mo of an Mo film inserted between an Ni film and a Si substrate diffuses toward the upper surface of the Si substrate, Ni of the Ni film diffuses toward the underlying Si substrate to form the NiSi film. Meanwhile, an upper layer observed in the HREM image is a layer made of an epoxy resin adhesive used in fabrication of the samples.

FIG. 6 is a graph showing quantitative analysis result by AES of distribution of elements present in the semiconductor device samples manufactured using Mo films as diffusion barrier films with varying RTA temperatures.

Figure 6A:
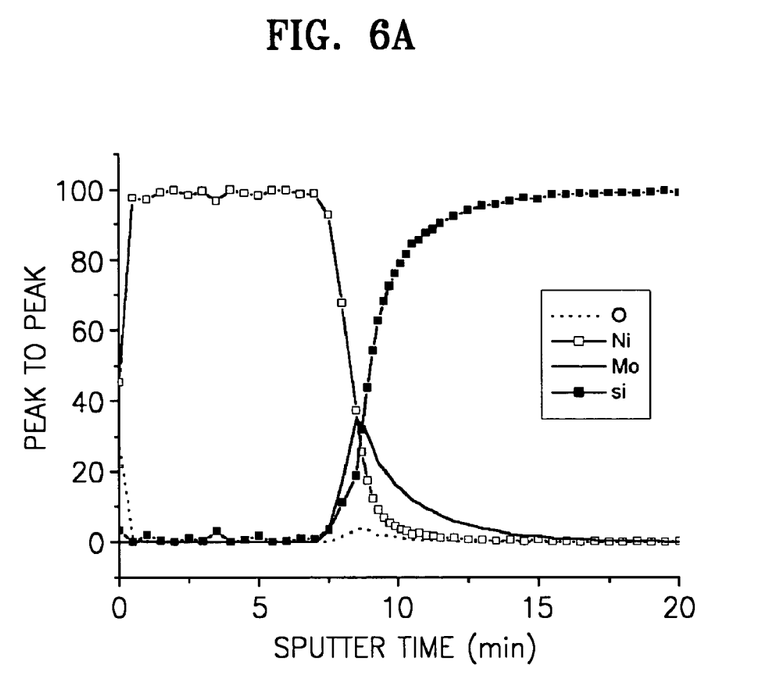
Figure 6B:
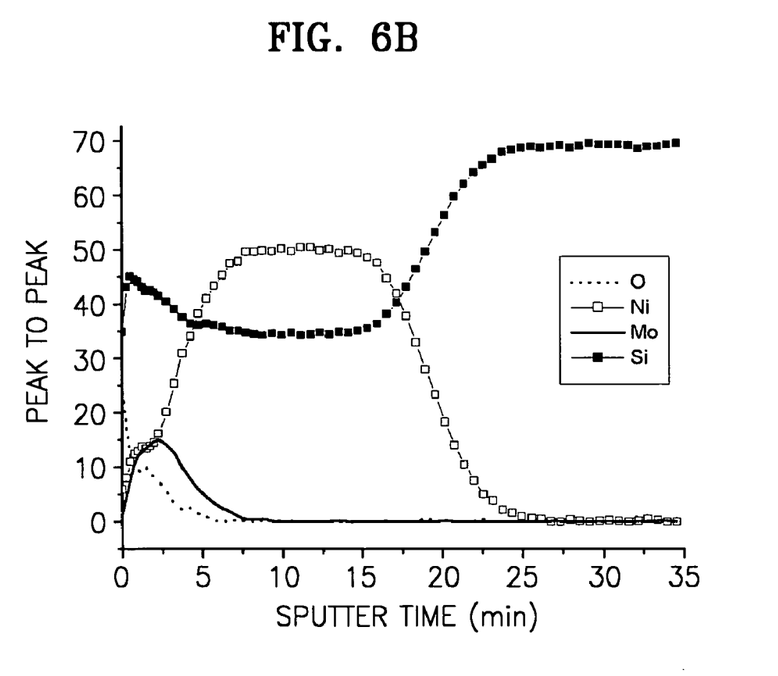
Figure 6C:
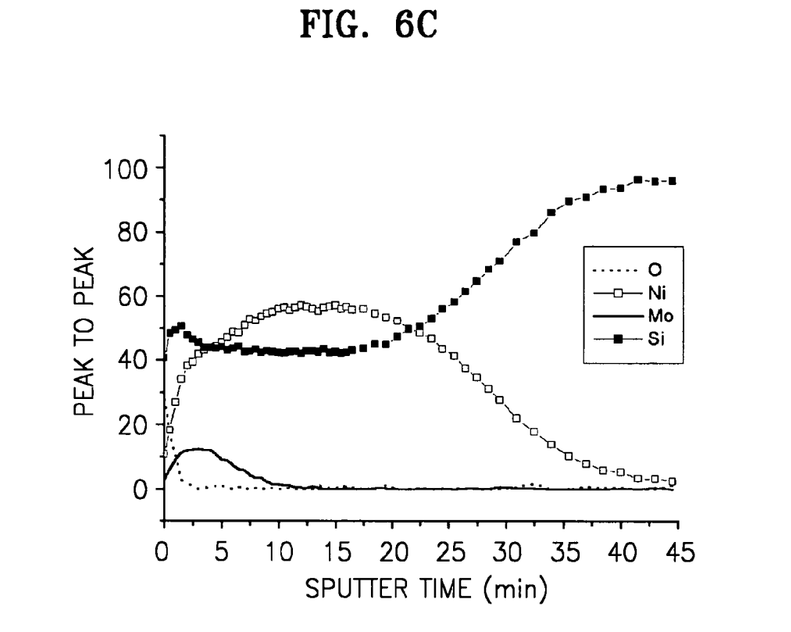

FIG. 6A shows distribution of elements present in the samples immediately after deposition of the Ni films (as-deposited). Referring to FIG. 6A, the deposited Mo and Ni films were distinctly arranged in a layered form. FIG. 6B shows distribution of elements present in the samples annealed at 500° C. and FIG. 6C shows distribution of elements present in the samples annealed at 800° C. Referring to FIGS. 6B and 6C, during the annealing, Mo outdiffused toward the surfaces of the Si substrates and Ni diffused into the Si substrates through the Mo films. As a result, Ni and Si react with each other to form the NiSi films.

Figure 7:
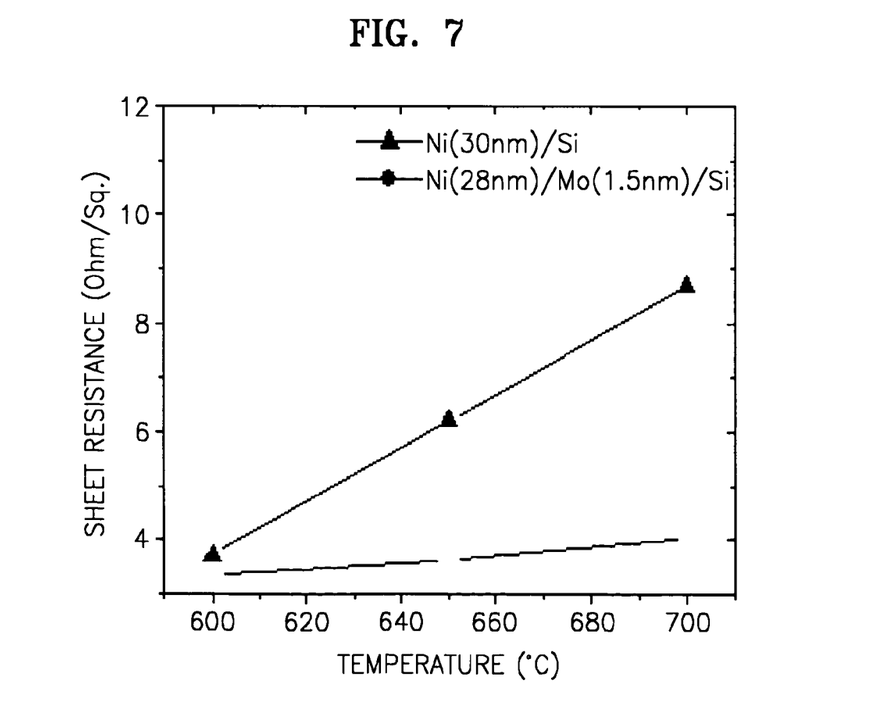
FIG. 7 is a graph illustrating a change of sheet resistance of NiSi films in semiconductor device samples manufactured with using Mo films as diffusion barrier films (Example) and without using diffusion barrier films (Comparative Example) as a function of temperature for two-step RTA.

FIG. 7 is a graph showing a change of sheet resistance of the NiSi films in the samples manufactured with using the Mo films as diffusion barrier films (Example) and without using diffusion barrier films (Comparative Example) as a function of a temperature for two-step RTA. The sheet resistance was measured by means of the 4-point probe method. In fabrication of actual semiconductor devices, after the formation of silicide films, a succeeding annealing process at a high temperature for a relatively long time is inevitably involved. In this regard, the measurement of sheet resistance of the NiSi films after two-step RTA is preferable for evaluation of thermal stability of the NiSi films.

Specifically, first, after the samples manufactured with and without using the Mo films were subjected to RTA at 600° C. under a nitrogen gas atmosphere and for 30 seconds, unreacted Ni was removed. Then, secondary annealing was carried out in a tube furnace at 600° C., 650° C., and 700° C., respectively, under a nitrogen gas atmosphere, and for 30 minutes. Referring to FIG. 7, it can be seen that in case of the samples (●) manufactured with using the Mo films, an increase rate of sheet resistance of the NiSi films with increasing of the secondary annealing temperature was much smaller than that of the samples (▲) manufactured without using the Mo films. This means that the samples manufactured with using the Mo films have more excellent thermal stability, when compared to those manufactured without using the Mo films.

Referring again to the TEM photographs of FIG. 5 and the AES results of FIG. 6, it can be seen that as RTA temperature increases, the Mo films move toward the surfaces of the Si substrates. This behavior can be explained by the differences in the effective driving forces for the reactions between Ni, Si, and Mo. Specifically, as disclosed in J. S. Kwak, E. J. Chi, J. D. Choi, S. W. Park, H. K. Baik, M. G. So, and S. M. Lee, Journal of Applied Physics, 78 (1995) pp. 983, the effective driving forces for the reactions between Si and Ni, between Si and Mo, and between Ni and Mo are −16.22 kJ/mol, −6.11 kJ/mol, and −1.50 kJ/mol, respectively. This indicates that Ni can easily react with Si, but Ni can hardly react with Mo. Therefore, as a RTA temperature increases, Ni diffuses into the Si substrates through the Mo films to react with Si. In this case, diffusion flux of Ni into the Si substrates becomes very uniform due to the presence of the Mo films, and thus, reaction of Ni with Si also becomes uniform. As a result, as seen from the SEM photographs of FIG. 4 and the TEM photographs of FIG. 5, the samples manufactured with using the Mo films exhibit uniform NiSi/Si substrate interfaces. This may be because the inserted Mo films adjust the diffusion flux of Ni to allow Ni and Si to uniformly react with each other. Further, at a RTA temperature of above 700° C., $MoSi_2$ can be formed since Mo and Si can react with each other at such a high temperature range.

Referring again to the SEM photographs of FIG. 4 and the TEM photographs of FIG. 5, low sheet resistance of the samples according to Example of the present invention as shown in FIG. 2 may be attributed to uniformity of surface morphology and NiSi/Si substrate interfaces. This is supported by the study results that silicide films with ununiform surface morphologies and interfaces serve as scattering sources that can interrupt carrier flow, thereby increasing sheet resistance [F. La Via, A. Alberti, V. Raineri, S. Ravesi, and E. Rimini, Journal of Vacuum Science & Technology B, 16 (1998) pp. 1129 and C. J. Choi, Y. W. Ok, T. Y. Seong and H. D. Lee, Japanese Journal of Applied Physics, 41 (2002) pp. 1969]. However, in case of the samples with the NiSi films formed according to Example of the present invention, the Mo films inserted between the Ni films and the Si substrates adjust diffusion flux of Ni, thereby improving reaction uniformity of Ni and Si, and thus, forming the uniform NiSi films. Therefore, the NiSi films formed according to Example of the present invention have low sheet resistance.

That NiSi films formed according to the present disclosure have excellent thermal stability can be explained in terms of agglomeration of NiSi. Agglomeration of silicide is a main factor of lowering thermal stability of silicide films. Agglomeration of silicide involves an initial step for formation of thermal grooves as shown in (a) of FIG. 5 and a final step for formation of silicide islands. These processes spontaneously occur to reduce surface energy and interface energy of silicide. That is, agglomeration of silicide closely relates with formation of thermal grooves. As seen from the TEM photograph of (b) in FIG. 5, in case of the samples manufactured with using the Mo films according to Example, after primary annealing, no thermal grooves were observed at interfaces between the NiSi films and the Si substrates. As a result, the samples of Example underwent less agglomeration during secondary annealing, when compared to the samples of Comparative Example with a large amount of thermal grooves after primary annealing. That may be why the samples of Example had excellent thermal stability.

As apparent from the above descriptions, according to the present invention, a metal silicide film is formed by depositing a diffusion barrier film between a metal film and a Si-containing substrate to form a laminated structure of the metal film/diffusion barrier film/Si-containing substrate, followed by annealing. The formed metal silicide film has uniform surface morphology and interface morphology. By using this process of the present invention, high performance, high quality semiconductor devices that exhibit low sheet resistance and excellent thermal stability can be manufactured.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a semiconductor device, the method comprising:
    forming a silicon (Si)-containing gate region, a gate oxide film, a sidewall spacer, and a source/drain region with a lightly doped drain (LDD) structure on a Si-containing substrate to form a transistor structure;
    forming a diffusion barrier film on the entire surface of the Si-containing substrate over the transistor structure;
    forming a metal film on the diffusion barrier film over the transistor structure; and
    annealing the Si-containing substrate so that the Si-containing gate region and the source/drain region react with the metal film to selectively form a metal silicide film only at the surfaces of the gate region and the source/drain region, wherein the diffusion barrier film, which is different from the metal film, is made of at least one selected from the group consisting of Mo, Ta, Mn, Cr, W, Pd, Au, Ag, Cu, Hf, Fe, Zn, Ru, Pb, Mg, and alloys thereof.

2. The method according to claim 1, further comprising removing unreacted metal after the formation of the metal silicide film.

3. The method according to claim 1, wherein the Si-containing substrate is made of one selected from the group consisting of monocrystalline Si, polycrystalline Si, doped Si, amorphou Si, $Si_xGe_{1-x}$ where x is any number satisfying 0<x<1, $Si_xN_{1-x}$ where x is any number satisfying 0<x<1, and SiC.

4. The method according to claim 1, wherein the metal film is made of at least one selected from the group consisting of Ni, Ti, Pt, Pd, Ir, Ta, Nb, V, Cr, Hf, Zr, Mo, and alloys thereof.

5. The method according to claim 1, wherein the diffusion barrier film has a thickness of 0.1 to 100 nm.

6. The method according to claim 1, wherein the metal film has a thickness of 1 to 1,000 nm.

7. The method according to claim 1, wherein the Si-containing substrate is annealed at a temperature of 100 to 1,000 C.

8. The method according to claim 1, wherein the metal silicide film is formed only on an upper surface of the Si-containing gate region and a high-concentration impurity region of the source/drain region.

9. The method according to claim 1, wherein the annealing is carried out in such a manner that the diffusion barrier film adjusts diffusion flux of a metal of the metal film so that the metal of the metal film uniformly reacts with Si of the gate region and the source/drain region.

10. The method according to claim 1, wherein the diffusion barrier film and the metal film are formed by e-beam evaporation, chemical vapor deposition (CVD), physical vapor deposition (PVD), molecular beam epitaxy (MBE), or sputtering.

11. The method according to claim 1, wherein the semiconductor device is a complementary metal oxide silicon (CMOS) logic device, a memory device, or an embedded memory device.

* * * * *